(12) United States Patent
Ido et al.

(10) Patent No.: US 7,932,779 B2
(45) Date of Patent: Apr. 26, 2011

(54) D-CLASS AMPLIFIER

(75) Inventors: Toru Ido, Osaka (JP); Soichiro Ishizuka, Kanagawa (JP)

(73) Assignee: Texas Instruments Incorporated, Dallas, TX (US)

( * ) Notice: Subject to any disclaimer, the term of this patent is extended or adjusted under 35 U.S.C. 154(b) by 174 days.

(21) Appl. No.: 12/102,163

(22) Filed: Apr. 14, 2008

(65) Prior Publication Data

US 2009/0302942 A1    Dec. 10, 2009

(30) Foreign Application Priority Data

Apr. 13, 2007    (JP) .................................. 2007-106041

(51) Int. Cl.
*H03F 3/217*    (2006.01)
(52) U.S. Cl. ......................................... 330/251; 330/10
(58) Field of Classification Search .................... 330/10, 330/207 A, 251; 381/94.5; 363/41; 332/109
See application file for complete search history.

(56) References Cited

U.S. PATENT DOCUMENTS 6,998,911 B2 * 2/2006 Honda et al. .................... 330/10
7,312,654 B2 * 12/2007 Roeckner et al. ............... 330/10

* cited by examiner

*Primary Examiner* — Robert Pascal
*Assistant Examiner* — Khiem D Nguyen
(74) *Attorney, Agent, or Firm* — John J. Patti; Wade J. Brady, III; Frederick J. Telecky, Jr.

(57) ABSTRACT

A D-class amplifier that can suppress noise generated when a D-class amplification operation is started/stopped. When a D-class amplification operation is started/stopped, the pulse widths and pulse interval of output signals Pout1, Pout2 are gradually changed, so it is possible to prevent a large variation in the signal fed as a differential signal of output signals Pout1, Pout2 to the load, and it is possible to reduce noise. That is, by gradually changing the pulse interval while keeping the pulse widths of output signals Pout1, Pout2 constant, it is possible to suppress variation in the relatively high frequency component corresponding to the component of the pulse signal. Also, by gradually changing the widths of output signals Pout1, Pout2 while keeping the pulse interval constant, it is possible to suppress variation in the relatively low frequency component corresponding to the average value of the pulse signal.

12 Claims, 4 Drawing Sheets

D-CLASS AMPLIFIER

TECHNICAL FIELD

The present invention pertains to a type of D-class amplifier that outputs pulse signals that are modulated corresponding to the input signal. Especially, the present invention pertains to a type of D-class amplifier that can reduce noise that is generated when operation is started and stopped.

BACKGROUND

A D-class amplifier is an amplifier that modulates a carrier signal by means of pulse width modulation, and, by switching the load current corresponding to the carrier signal, transmits a power-amplified signal to the load. It is also known as a digital amplifier. The D-class amplifier has an advantage that it can significantly lower the loss in power as compared to that of an A-class and B-class and other linear amplifiers (see Japanese Kokai Patent Application No. 2006-129366).

However, for devices that handle audio signals, when the amplifier is turned ON/OFF due to ON/OFF of the power source, due to transient operation of the circuit, the output signal varies drastically, and such variation in signal leads to unpleasant noise (popping noise). Consequently, especially for audio amplifiers, reduction in the noise generated in ON/OFF has become a topic to be addressed. In A-class and AB-class amplifiers having positive/negative outputs for driving speakers, several schemes have been proposed to reduce the popping noise when starting, such as a method in which positive/negative output voltages are gradually raised from the ground potential to an intermediate potential, and a method in which the popping noise at the start is reduced using a scheme of addition of a mute switch, relay or the like.

However, for a D-class amplifier, usually, even if the average value of the positive/negative output signals is zero, the load current is still switched corresponding to the carrier signal. Consequently, when started/stopped, discontinuous amplitude variation occurs between the non-switching state and the switching state, and rapid variation in the output signal caused by popping noise can readily occur, and this is undesired.

FIG. 6 is a waveform diagram illustrating variation in the output signal when a D-class amplifier is started/stopped.

When starting (left side in FIGS. 6(A), (B)), both the positive and negative outputs Pout1 and Pout2 initially become the ground potential (VL), and switching is stopped. On the other hand, after starting, a mute state forms (the right side in FIGS. 6(A), (B)), the positive and negative outputs Pout1 and Pout2 become switching waveforms in opposite phases and having a duty ratio of 50%. That is, in the start mode, as the state is changed from a state in which the switching is OFF to a state in which switching occurs at maximum amplitude, the amplitude of the carrier component of the output signal changes tremendously. In a stop operation, it is the same as above, and a large change takes place from a state in which switching is performed at maximum amplitude to a state in which switching is OFF (FIGS. 6(C), (D)). Here, because the outputs of the D-class amplifier are positive and negative outputs Pout1 and Pout2, in the state shown on the right side of FIGS. 6(A), (B), the average value of the output components is zero.

In order to suppress the variation in the output signals, a method has been proposed in which in the start operation, the amplitude of the switching waveform is gradually increased from zero to the maximum amplitude value. However, for a conventional D-class amplifier, because the power source voltage of the output stage becomes the maximum amplitude value of the switching waveform, the output voltage of the power source circuit for executing this method should be freely adjustable, leading to a complicated power source circuit and a fall in the power efficiency.

A general object of the present invention is to reduce or eliminate the problems of the prior art by providing a type of D-class amplifier that can suppress noise generated when the D-class amplification operation is turned ON/OFF.

SUMMARY

This and other objects and features of the present invention are provided, in '08 accordance with a first aspect, which provides a type of D-class amplifier characterized by the following facts: it works as follows: in the operation of the D-class amplifier, a first signal and a second signal are output with the pulse-width modulated corresponding to an input signal and with one rising while the other falls; in this D-class amplifier, there is a signal processing circuit that works as follows: when the D-class amplification operation starts, while the pulse widths of the first signal and the second signal are set at a predetermined minimum value, and the interval between the pulses of both signals is set at a predetermined minimum value, the pulse interval is then slowly increased from the minimum value, and, when the pulse interval reaches a maximum value, the pulse widths of the two signals are gradually increased until the first signal and the second signal become signals with a duty ratio of 50% and in phases opposite each other.

For this aspect of the D-class amplifier, when the D-class amplification operation is started, the pulse widths of the first signal and the second signal are set at the predetermined minimum value, respectively, and the interval between their pulses is set at the predetermined minimum value. In this state, the pulse interval is gradually increased from the minimum value.

When both the pulse width and the pulse interval are at the minimum values, the differential signal between the first signal and the second signal has a component at a relatively high frequency; when the pulse interval between the two signals spreads, the frequency component of the differential signal gradually changes to the low region. That is, the frequency component of the differential signal gradually changes from a high region to a low region. Because the pulse widths of the first signal and the second signal do not vary, the average value of the differential signal is nearly constant.

Then, when the pulse interval between the first signal and the second signal reaches the maximum value, that is, the phase difference between the two signals reaches 180°, the pulse widths of the two signals are gradually increased until the first signal and the second signal become signals with phases opposite each other (duty ratio of 50%, phase difference of 180°). Because the pulse widths of the first signal and the second signal both increase, there is little change in the average value of the differential signal. When the first signal and the second signal become signals having phases opposite each other, both the first signal and the second signal become pulse signals with a duty ratio of about 50%.

In one aspect, the signal processing circuit has a pulse-width modulating circuit, an input signal control circuit, and a pulse-width control circuit. The pulse-width modulating circuit outputs a first modulated signal and a second modulated signal, which are pulse-width modulated corresponding to the input signal with one rising while the other falls, the input signal control circuit controls the input signal such that when the D-class amplification operation starts, the pulse width is changed slowly from a first state, in which one of the first modulated signal and the second modulated signal has the minimum pulse width while the other has the maximum pulse width, to a second state, in which the two have the same pulse width.

The pulse-width control circuit is a pulse-width control circuit that outputs the pulse-width controlled signals as the first signal and the second signal as the fall times of the first modulated signal and the second modulated signal approach the rise times, or the rise times approach the fall times, and the pulse-width control circuit controls the pulse width when the D-class amplification operation is started so that a third state forms in which the pulse widths of the first signal and second signal become the minimum value, respectively, and the pulse-width control is gradually relaxed and released when the second state is reached.

When the D-class amplification operation is started, first of all, the input signal control circuit controls the input signal of the pulse-width modulating circuit such that the pulse width of one of the first modulated signal and the second modulated signal becomes the minimum value, while the other becomes the maximum value (first state). In this case, the pulse-width control circuit controls such that the third state forms in which the pulse widths of the first signal and the second signal both become the minimum value.

In this state (the first state), under control of the input signal by the input signal control signal, the pulse width of one of the modulated signals is gradually increased from the minimum value, and, at the same time, the pulse width of the other modulated signal is gradually reduced from the maximum value. As a result, the two pulse widths become equal (the second state). For the first modulated signal and the second modulated signal, one rises and the other falls. Consequently, due to variation in the pulse widths, the rise time and fall time of the two signals gradually diverge. When both pulse widths become equal, the rise times of the two signals are farthest from each other. When the rise times are farthest a circuit, the pulse interval between the first signal and the second signal becomes the maximum value, and the phase difference between the two signals is about 180°.

In this state (second state), control of the pulse widths by the pulse-width control circuit is gradually relaxed, and the pulse widths of the first signal and the second signal gradually increase. Finally, control of the pulse widths is released, and the pulse widths of the two signals become nearly equal.

In one aspect, the pulse-width control circuit has a pulse-width control circuit that controls the pulse width of the first signal, a pulse-width control circuit that controls the pulse width of the second signal, and a control circuit. The pulse-width control circuit and the pulse-width control circuit each have the following circuits: a signal output circuit, which outputs the first signal having a first level when the voltage of the input terminal is higher than a threshold or the second signal having a second level when the voltage is lower than a threshold, a capacitor circuit, which is connected to the input terminal for which the capacitance varies corresponding to the control signal of the control circuit, a detecting circuit, which detects the rise time or fall time of the first modulated signal or the second modulated signal, and a charge/discharge circuit, which charges the capacitor circuit such that the voltage of the input terminal exceeds the threshold when the detecting circuit detects the rise time or the fall time, and which discharges the capacitor circuit at a constant current such that the voltage of the input terminal falls below the threshold after the charging.

The control circuit sets the capacitance of the capacitor circuit at a first value when the D-class amplification operation is started, and it gradually changes the capacitance of the capacitor circuit to a second value larger than the first value when the second state is reached.

When the rise time or fall time of the first modulated signal (or the second modulated signal) is detected by the detecting circuit, the capacitor circuit is charged such that the voltage at the input terminal of the signal output circuit exceeds the threshold. Then, after the charging, the capacitor circuit is discharged at a constant current so that the voltage at the input terminal falls below the threshold. Consequently, when the capacitance of the capacitor circuit increases, the time during which the voltage at the input terminal is lower than the threshold increases, so the pulse width of the first signal (or the second signal) output from the signal output circuit increases.

When the D-class amplification operation is started, the capacitance of the capacitor circuit is set at a first value, and it is kept at the first value from the first state to the second state. Consequently, the pulse width of the first signal (or the second signal) in this case is constant.

When the second state is reached, corresponding to the control signal, the capacitance of the capacitor circuit gradually changes to a second value larger than the first value, so the pulse width of the first signal (or the second signal) gradually increases.

On the other hand, when the D-class amplification operation is stopped, the signal processing circuit gradually reduces the pulse widths of the first signal and the second signal, and it sets each of the pulse widths at the minimum value, respectively, and, at the same time, sets the pulse interval between the first signal and the second signal at the maximum, and it then gradually reduces the pulse interval between the two signals from the maximum to the predetermined minimum value.

When the D-class amplification operation is stopped, the pulse widths of the first signal and the second signal gradually decrease. As a result, the pulse widths become the predetermined minimum values, respectively, and, at the same time, the pulse interval between the first signal and the second signal becomes the maximum. In this case, because the pulse widths of both the first signal and the second signal decrease, variation in the average value of the differential signal can be suppressed to a very small value.

Then, when the pulse widths of the first signal and the second signal become the minimum, the pulse interval between both signals is gradually reduced from the maximum value to the minimum value. When the pulse interval between the two signals becomes the maximum value, the differential signal has a relatively low frequency component, and, as the pulse interval between the two signals becomes smaller, the frequency component of the differential signal gradually changes to a higher region. That is, the frequency component of the differential signal gradually changes from a lower region to a higher region. Because there is no change in the pulse widths of the two signals, the average value of the differential signal is nearly constant.

Also, when the D-class amplification operation is stopped, the signal processing circuit controls the input signal such that the pulse widths of the first signal and the second signal become gradually equal before the pulse widths of the first signal and the second signal are gradually reduced.

When the D-class amplification operation is stopped, the input signal is controlled such that the pulse widths of the first signal and the second signal gradually become equal. In this case, the average value of the differential signal of the first signal and the second signal decreases as the pulse widths of the two signals approach each other, and, it becomes about zero when the pulse widths of the two signals become equal. Then, when the pulse widths of the first signal and the second signal are gradually reduced to the minimum value, the variation in the average value of the differential signal is suppressed to a very small value, and the average value is nearly kept at zero.

Also, when the D-class amplification operation is stopped, the signal processing circuit can have a pulse-width modulating circuit, a pulse-width control circuit, and an input control circuit.

In this case, the pulse-width modulating circuit outputs a first modulated signal and a second modulated signal, which are pulse-width modulated corresponding to the input signal with one rising while the other falls; the pulse-width control circuit is a pulse-width control circuit that outputs pulse-width controlled signals as the first signal and the second signal as the fall times of the first modulated signal and the second modulated signal approach the rise times, or the rise times approach the fall times, and when the D-class amplification is stopped, it gradually reduces the pulse widths of the two signals from a fourth state in which the pulse width of the first signal and the pulse width of the second signal are equal to the third state in which the pulse widths of the two signals become the predetermined minimum value, respectively.

The input signal control circuit controls the input signal such that when the D-class amplification operation is stopped, the pulse width is changed slowly to the second state, in which the first modulated signal and the second modulated signal have the same pulse width, and then it controls the input signal such that when the state becomes the third state from the fourth state, the state gradually becomes the first state in which the pulse width of one of the first modulated signal and the second modulated signal has the minimum value and the pulse width of the other signal has the maximum value.

According to this aspect, when the D-class amplification operation is stopped, first of all, the input signal is controlled in the input signal control circuit such that the pulse widths of the first modulated signal and the second modulated signal gradually become equal. When the pulse widths of the first modulated signal and the second modulated signal become equal (second state), the pulse widths of the first signal and the second signal also become equal (fourth state).

When the pulse widths of the first signal and the second signal are equal (the fourth state), by means of control of the pulse width of the pulse-width control circuit, the pulse widths of the first signal and the second signal are gradually reduced, and they become the minimum value, respectively (third state). Here, for the first modulated signal and second modulated signal, a relationship exists in that while one of them rises, the other falls. Also, in the pulse-width control circuit, the pulse width is controlled as the modulated signals have the fall time approach the rise time, or have the rise time approach the fall time, the pulse widths of the first signal and the second signal become the minimum, and the pulse interval between the two signals becomes the maximum (the third state).

When the pulse widths of the first signal and the second signal become the minimum (the third state), the state is gradually changed to the first state in which the pulse width of one of the first modulated signal and the second modulated signal is at the minimum value, while the other has the maximum pulse width. The first modulated signal and the second modulated signal have a relationship in that as one rises, the other falls, and due to the variation in the pulse width, the rise times of the two signals gradually approach each other, and, when the pulse widths of the two signals reaches the first state, the rise times of the two signals are nearest each other.

According to a second aspect of the present invention, the D-class amplifier has a pulse-width modulated signal generating circuit that responds to an input signal to generate a pulse-width modulated signal and a pulse-width modulated signal, which have their rise edge and fall edge synchronized with the fall edge and rise edge, a pulse-width control circuit that generates third and fourth pulse-width modulated signals having predetermined pulse widths and synchronized with the rise edge or fall edge of the first and pulse-width modulated signals, respectively, and an output circuit that outputs the third and fourth pulse-width modulated signals as the first and second output signals.

The pulse-width modulated signal generating circuit contains a circuit that gradually changes the pulse widths of the first and pulse-width modulated signals such that the state changes from a first state, in which the pulse width of the pulse-width modulated signal is large, while the pulse width of the pulse-width modulated signal is small, to a second state, in which the duty ratios of the first and pulse-width modulated signals each are 50%.

The pulse-width control circuit contains a circuit that gradually controls the pulse widths of the third and fourth pulse-width modulated signals such that the state changes from a third state in which the pulse widths of the third and fourth pulse widths are small to a fourth state in which the duty ratios of the third and fourth pulse-width modulated signals are 50%.

By changing the pulse widths of the first and pulse-width modulated signals from the first state to the second state, the state is changed from a state in which the phase difference of the third and fourth pulse-width modulated signals is small to a state in which the phase difference is 180°. By changing the first and pulse-width modulated signals from the first state to the second state, and changing the third and fourth pulse-width modulated signals from the third state to the fourth state, the pulse waveforms of the third and fourth pulse-width modulated signals are controlled to become identical to the pulse waveforms of the first and pulse-width modulated signals.

REFERENCE NUMERALS AND SYMBOLS AS SHOWN IN THE DRAWINGS

In the figures, 1 represents a mute circuit, 2 a signal generator, SW1 a switching circuit, 3 a pulse-width modulating circuit or pulse-width modulator, 4-1 a pulse-width control circuit or pulse-width modulator controller, 4-2 a pulse-width control circuit or pulse-width modulator controller, 41 an edge detector, 42 a charge/discharge circuit, 43 a capacitor circuit, 44 a signal output circuit, 45 a pulse width limiter, 5 a pulse-width control signal generating circuit or pulse-width control signal generator, 6-1, 6-2 an output stopping circuit, 7-1, 7-2 an output circuit.

DETAILED DESCRIPTION

According to the present invention, it is possible to suppress a discontinuous variation in the output signal and to suppress generated noise when a D-class amplification operation is started/stopped.

Figure 1:
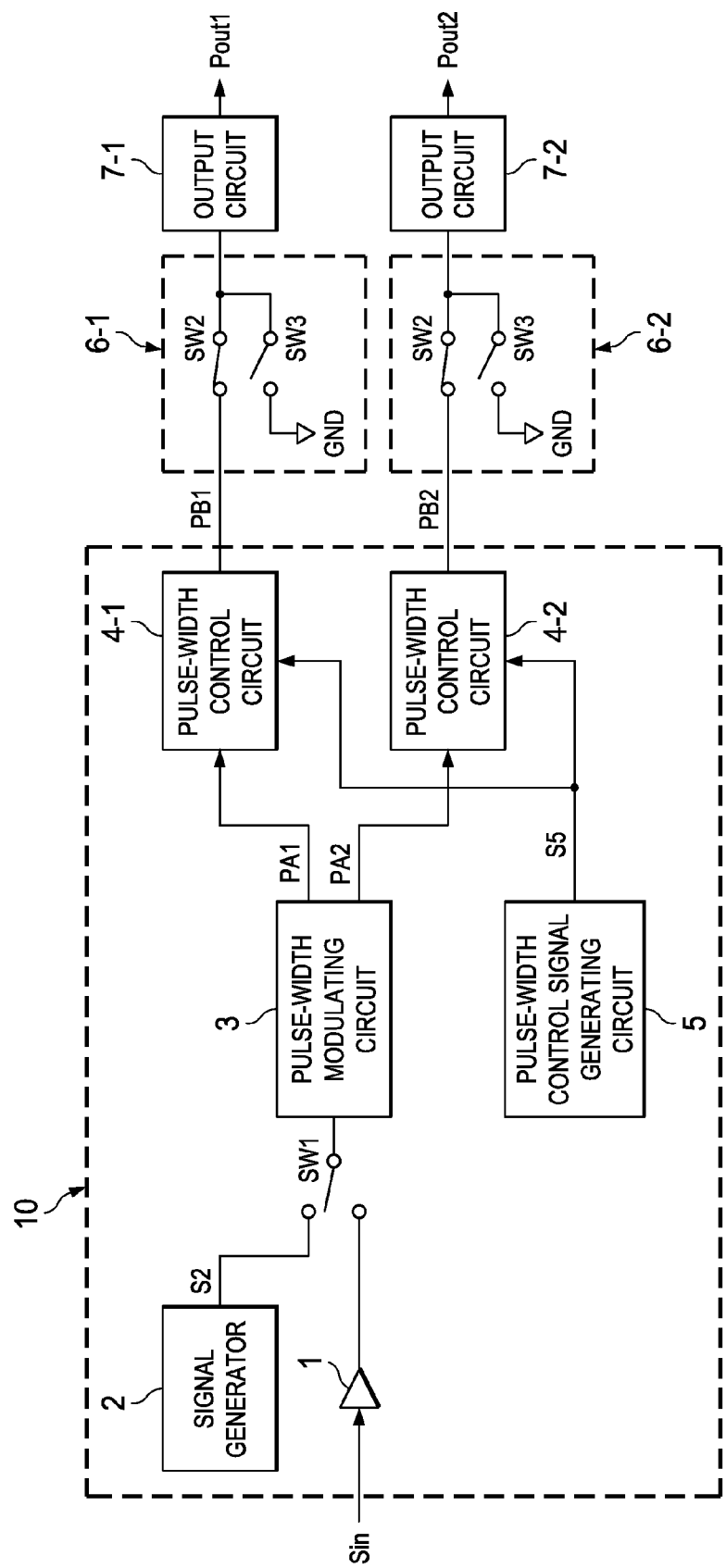
FIG. 1 is a diagram illustrating an example of a D-class amplifier pertaining to an embodiment of the present invention.

FIG. 1 is a diagram illustrating an example of a D-class amplifier in an embodiment of the present invention. The D-class amplifier shown in FIG. 1 comprises signal processing circuit 10, output stopping circuits 6-1, 6-2, and output circuits 7-1, 7-2.

The signal processing circuit 10 outputs pulse-width modulated signals PB1, PB2 that are pulse-width modulated corresponding to input signal Sin. The pulse-width modulated signals PB1, PB2 have a relationship in the D-class amplification operation that while one rises, the other falls (complementary relationship). The pulse-width modulated signals PB1, PB2 are power amplified in output circuits 7-1, 7-2 in the latter stage, and are fed to the two terminals of a load (e.g., a speaker) not shown in the figure. That is, the signal obtained by power amplification of the differential signal of pulse-width modulated signals PB1, PB2 is fed to the two terminals of the load.

The signal processing circuit 10 controls the pulse widths and the pulse interval of pulse-width modulated signals PB1, PB2 such that when the D-class amplification operation is started/stopped, transient noise generated due to variation of the waveforms of pulse-width modulated signals PB1, PB2 between the non-switching state and the switching state is reduced.

When the D-class amplification operation is started, signal processing circuit 10 gradually increases the pulse interval from the minimum value where the pulse widths of pulse-width modulated signals PB1, PB2 are set at minimum values, respectively, and, at the same time, the interval between the pulses of the two signals is set at the predetermined minimum value. Then, when the pulse interval reaches the maximum value (phase difference of 180°), the pulse widths of the two signals are gradually increased until pulse-width modulated signals PB1, PB2 become signals with phases opposite each other (duty ratio of 50%, phase difference of 180°).

On the other hand, when the D-class amplification operation is stopped, signal processing circuit 10 controls the input signal such that the pulse widths of pulse-width modulated signals PB1, PB2 gradually become equal (signals in phases opposite each other and with a duty ratio of 50%) (that is, the average value of the differential component of pulse-width modulated signals PB1, PB2 gradually becomes zero). When the pulse widths of the two signals become equal, signal processing circuit 10 gradually reduces the pulse widths of pulse-width modulated signals PB1, PB2, and, while the pulse widths of the two signals are set at the minimum values, respectively, the pulse interval between the two signals becomes the maximum (phase difference of 180°). Then, signal processing circuit 10 gradually reduces the pulse interval between the two signals from the maximum value (phase difference of 180°) to the predetermined minimum value.

For example, as shown in FIG. 1, the signal processing circuit 10 comprises mute circuit 1, signal generating circuit 2, switching circuit SW1, pulse-width modulating circuit 3, pulse-width control circuit 4-1, pulse-width control circuit 4-2, and pulse-width control signal generating circuit 5.

The unit comprising the mute circuit 1, signal generating circuit 2 and switching circuit SW1 pertains to an embodiment of the input signal control circuit of the present invention. The pulse-width modulating circuit 3 pertains to an embodiment of the pulse-width modulating circuit in the present invention. The pulse-width control circuit 4-1 pertains to an embodiment of the pulse-width control circuit of the present invention.

The pulse-width control circuit 4-2 pertains to an embodiment of the pulse-width control circuit in the present invention. The pulse-width control signal generating circuit 5 pertains to an embodiment of the control circuit in the present invention.

The mute circuit 1 controls such that when the power is turned OFF or when the D-class amplification operation is paused, the level of input signal Sin gradually approaches a reference value, the duty ratios of pulse-width modulated signals PA1, PA2 each become 50%, and the phase difference between the two signals becomes 180°. When the level of input signal Sin becomes the reference value, pulse-width modulated signals PA1, PA2 output from pulse-width modulating circuit 3 become signals in phases opposite each other and having a duty ratio of 50%, and the average value of the differential signal becomes zero. When the average value of the differential signal between pulse-width modulated signals PA1, PA2 becomes zero, the average value of the signal (the differential signal between output signals Pout1, Pout2) fed to the two terminals of the load via latter stage width control circuits 4-1, 4-2 and output circuits 7-1, 7-2. That is, when a speaker is driven, the average value of the differential signal becomes zero, and a mute state exists. The signal generator 2 generates signal S2 input to pulse-width modulating circuit 3 instead of input signal Sin when the D-class amplification operation is started/stopped.

When the D-class amplification operation is started, signal generator 2 generates signal S2 such that the pulse width of pulse-width modulated signal PA1 is at a maximum, while the pulse width of pulse-width modulated signal PA2 is at a minimum. Then, signal S2 is changed such that the pulse width varies from the state (first state) to a state (second state) in which the pulse widths of pulse-width modulated signals PA1, PA2 become equal (signals in phases opposite each other and with a duty ratio of 50%). Also, the arrangment may be such that the pulse width of pulse-width modulated signal PA1 is at a minimum, while the pulse width of pulse-width modulated signal PA2 is at a maximum.

On the other hand, when the D-class amplification operation is stopped, signal generator 2 sets the level of input signal Sin at the reference value (second state) in mute circuit 1 such that pulse-width modulated signals PA1, PA2 become signals in phases opposite each other and with a duty ratio of 50%, and it generates signal S2 at the same level as that of mute circuit 1 for feeding to pulse-width modulating circuit 3. Then, as the pulse widths of pulse-width modulated signals PB1, PB2 are set at the minimum in pulse-width control circuits 4-1, 4-2 (third state), the level of signal S2 is gradually changed such that the pulse width of pulse-width modulated signal PA1 reaches a maximum, while the pulse width of pulse-width modulated signal PA2 reaches a minimum (first state).

The switching circuit SW1 feeds input signal Sin to pulse-width modulating circuit 3 in the case of D-class amplification operation, and it feeds signal S2 of signal generator 2 instead of input signal Sin to pulse-width modulating circuit 3 when the D-class amplification operation is started/stopped.

Corresponding to control signal S5 of pulse-width control signal generating circuit 5, the pulse-width control circuit 4-1 and pulse-width control circuit 4-2 control the pulse widths of pulse-width modulated signals PA1, PA2 output from pulse-width modulating circuit 3. That is, corresponding to control signal S5, pulse-width control circuit 4-1 generates a pulse-width controlled signal such that the fall edge of pulse-width modulated signal PA1 approaches the rise edge, and it outputs the signal as pulse-width modulated signal PB1. Corresponding to control signal S5, the pulse-width control circuit 4-2 generates a pulse-width controlled signal such that the fall edge of pulse-width modulated signal PA2 approaches the rise edge, and it outputs the signal as pulse-width modulated signal PB2. The pulse-width control circuits 4-1, 4-2 may also have a arrangement wherein a pulse-width controlled signal is generated such that the rise edges of pulse-width modulated signals PA1, PA2 approach the fall edges.

Figure 2:
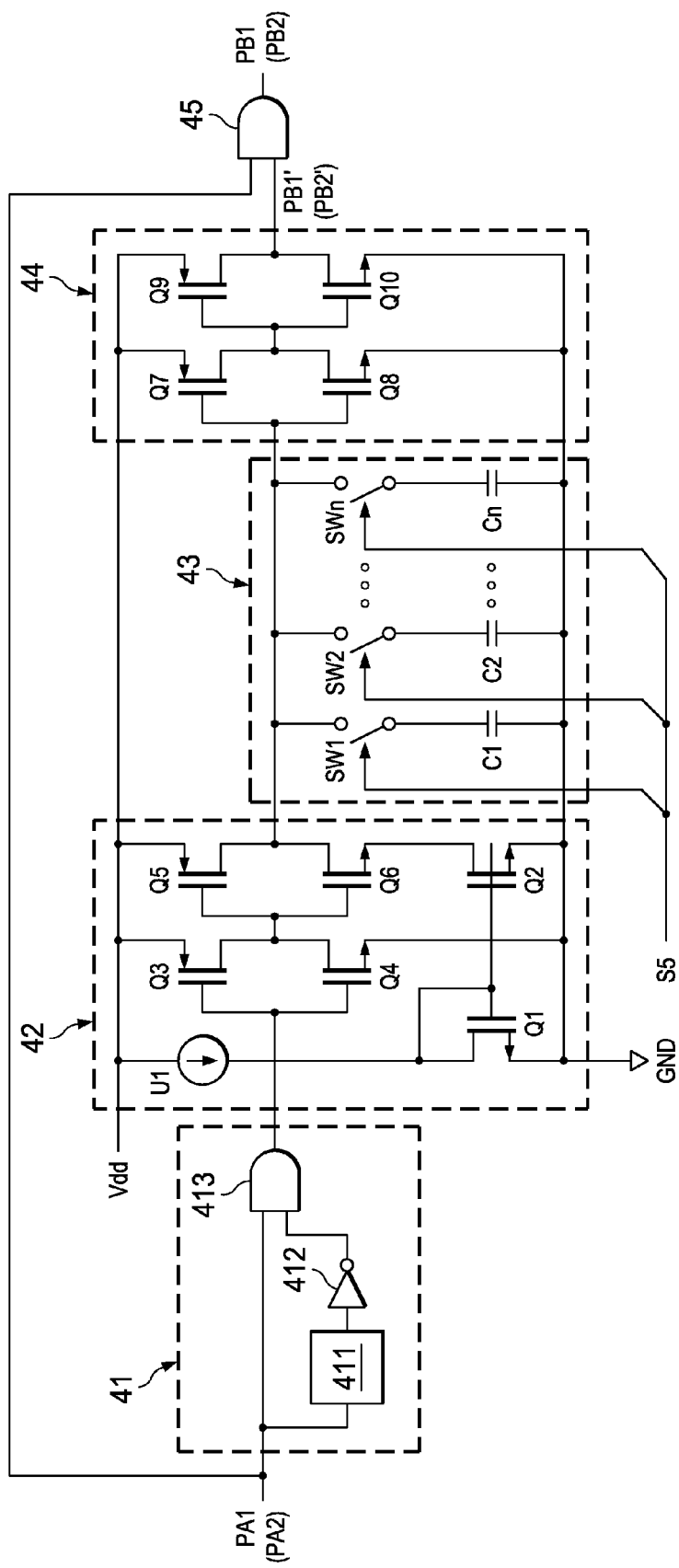
FIG. 2 is a diagram illustrating an example of a pulse-width modulated signal and a pulse-width modulated signal.

FIG. 2 is a diagram illustrating an example of pulse-width control circuit 4-1 and pulse-width control circuit 4-2. Each of the pulse-width control circuit 4-1 and pulse-width control circuit 4-2 shown in FIG. 2 has edge detector 41, charge/discharge circuit 42, capacitor circuit 43, signal output circuit 44, and pulse width limiter 45.

In the example shown in FIG. 2, because the pulse-width control circuit 4-1 has the same arrangement as that of pulse-width control circuit 4-2, in the following an explanation will be given only regarding pulse-width control circuit 4-1, while an explanation of pulse-width control circuit 4-2 will not be given.

The edge detector 41 is a circuit for detecting the rise time of pulse-width modulated signal PA1. For example, as shown in FIG. 2, it comprises delay circuit 411, inverter 412, and AND circuit 413. Here, delay circuit 411 delays pulse-width modulated signal PA1, inverter 412 logically inverts the output signal of delay circuit 411, and AND circuit 413 determines the AND of pulse-width modulated signal PA1 and the output signal of inverter 412.

When pulse-width modulated signal PA1 is at low level, the output signal of inverter 412 is at high level. Consequently, the output signal of AND circuit 413 becomes low level. Just after pulse-width modulated signal PA1 rises from low level, the output signal of inverter 412 is at high level as is due to the delay of delay circuit 411. Consequently, the output signal of AND circuit 413 becomes high level. After a predetermined delay time from the rise edge of pulse-width modulated signal PA1, the output signal of inverter 412 becomes low level, so that the output signal of AND circuit 413 becomes low level. When pulse-width modulated signal PA1 becomes the low level, the output signal of AND circuit 413 becomes low level independent of the output signal of inverter 412. Consequently, according to the circuit of FIG. 2, at the rise edge of pulse-width modulated signal PA1, a pulse signal at high level is output from AND circuit 413.

When edge detector 41 detects the rise time of pulse-width modulated signal PA1, charge/discharge circuit 42 charges capacitor circuit 43 to power source voltage Vdd, and, after the charging, capacitor circuit 43 is discharged at a constant current to reference potential GND.

In the example shown in FIG. 2, the charge/discharge circuit 42 comprises NMOS transistors Q1, Q2, Q4, Q6, PMOS transistors Q3, Q5, and constant current circuit U1. The PMOS transistor Q3 and NMOS transistor Q4 form the first stage of an inverter. The source of PMOS transistor Q3 is connected to power source voltage Vdd; the drain of PMOS transistor Q3 is connected to the drain of NMOS transistor Q4; and the source of NMOS transistor Q4 is connected to reference potential GND. The output signal of AND circuit 413 is input to the gates of PMOS transistor Q3 and NMOS transistor Q4.

The PMOS transistor Q5 and NMOS transistor Q6 form the second stage of the inverter. The source of PMOS transistor Q5 is connected to power source voltage Vdd; the drain of PMOS transistor Q5 is connected to the drain of NMOS transistor Q6; and the source of NMOS transistor Q6 is connected via NMOS transistor Q2 to reference potential GND. The gates of PMOS transistor Q5 and NMOS transistor Q6 are connected to the output of the first stage of the inverter (Q3, Q4). The NMOS transistors Q1, Q2 form a current mirror circuit. The drain and gate of NMOS transistor Q1 are connected to the gate of NMOS transistor Q2, and the source of NMOS transistor Q1 is connected to reference potential GND. The constant current circuit U1 is a circuit for inputting a constant current to current mirror circuit (Q1, Q2), and it keeps a constant current flowing from power source voltage Vdd to the drain of NMOS transistor Q1. A constant current corresponding to the current of constant current circuit U1 flows into NMOS transistor Q2.

When edge detector 41 outputs a high level pulse signal indicating the rise time of pulse-width modulated signal PA1, PMOS transistor Q3 is turned OFF, NMOS transistor Q4 is turned ON, and the gates of PMOS transistor Q5 and NMOS transistor Q6 become low level. Consequently, PMOS transistor Q5 is turned ON, and NMOS transistor Q6 is turned OFF. When PMOS transistor Q5 is turned ON, capacitor circuit 43 is charged to power source voltage Vdd. When the output of edge detector 41 returns to low level, the scenario is opposite above, that is, PMOS transistor Q5 is turned OFF, and NMOS transistor Q6 is turned ON. When NMOS transistor Q6 is turned ON, capacitor circuit 43 discharges by the constant current flowing in NMOS transistor Q2 to the reference potential GND.

The capacitor circuit 43 is connected to the input terminal of signal output circuit 44, and the capacitance varies corresponding to control signal S5 of pulse-width control signal generating circuit 5. For example, as shown in FIG. 2, capacitor circuit 43 has n capacitors connected in parallel (where n represents any integer of 2 or larger), that is, capacitors C1, ..., Cn, and switching circuits SW1, ..., SWn. Switching circuit SWi (where i is an integer ranging from n to 1) is connected in series with capacitor Ci, and, when switching circuit SWi is turned OFF, capacitor Ci is cut off from the other capacitors of the charge/discharge circuit.

The signal output circuit 44 outputs pulse-width modulated signal PB1' that behaves as follows: when the voltage at the input terminal exceeds the threshold, it becomes high level, and, when the voltage is lower than the threshold, it becomes low level. For example, signal output circuit 44 has the 2-stage inverter shown in FIG. 2. Here, PMOS transistor Q7 and NMOS transistor Q8 form the first stage of the inverter. The source of PMOS transistor Q7 is connected to power source voltage Vdd, the drain of PMOS transistor Q7 is connected to the drain of NMOS transistor Q8, and the source of NMOS transistor Q8 is connected to reference potential GND. The gates of PMOS transistor Q7 and NMOS transistor Q8 are connected to the output of capacitor circuit 43. PMOS transistor Q9 and transistor Q10 form the second stage of the inverter. The source of PMOS transistor Q9 is connected to power source voltage Vdd, the drain of PMOS transistor Q9 is connected to the drain of NMOS transistor Q10, and the source of NMOS transistor Q10 is connected to reference potential GND. The gates of PMOS transistor Q9 and NMOS transistor Q10 are connected to the output of the first stage of the inverter (Q7, Q8).

The pulse width limiter 45 is made of an AND circuit. It takes pulse-width modulated signal PA1 and pulse-width modulated signal PB1' as inputs, and it outputs pulse-width modulated signal PB1. The pulse width limiter 45 is for preventing the output of a signal with a pulse width larger than that of pulse-width modulated signal PA1 When edge detector 41 detects the rise time of pulse-width modulated signal PA1, pulse-width control circuit 4-1 shown in FIG. 2 outputs a high level pulse signal from AND circuit 413, and turns ON PMOS transistor Q5. As a result, a charging current flows into capacitor circuit 43, the voltage at the input terminal of signal output circuit 44 rises to power source voltage Vdd, and the output of signal output circuit 44 (pulse-width modulated signal PB1) becomes high level. After the charging, the output of AND circuit 413 returns to low level, so that NMOS transistor Q6 is turned ON. Consequently, capacitor circuit 43 is discharged at a constant current. When the voltage of capacitor circuit 43 falls below the threshold, the output of signal output circuit 44 (pulse-width modulated signal PB1') becomes low level. Consequently, when the capacitance of capacitor circuit 43 is increased by means of control signal S5, the time required for the voltage at the input terminal of signal output circuit 44 to reach power source voltage Vdd increases. Consequently, the pulse width of pulse-width modulated signal PB1' output from signal output circuit 44 increases.

Figure 3:
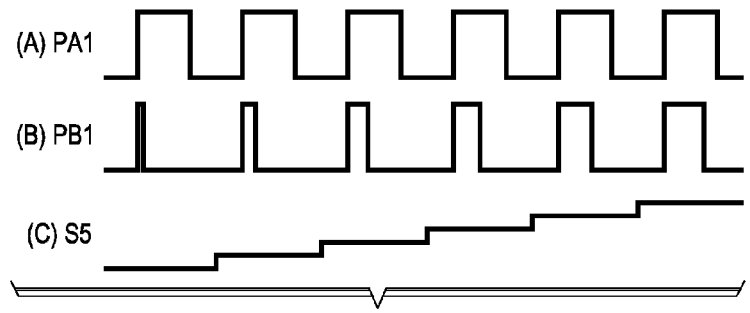
FIG. 3 is a waveform diagram illustrating the operation of the pulse-width modulated signal.

FIG. 3 is a diagram illustrating waveforms in the operation of pulse-width control circuit 4-1.

FIG. 3(A) shows the waveform of pulse-width modulated signal PAL FIG. 3(B) shows the waveform of pulse-width modulated signal PB1. FIG. 3(C) shows the variation in the setting value of control signal S5. When the setting value of control signal S5 is proportional to the capacitance of capacitor circuit 43, as shown in FIG. 3, the larger the setting value of control signal S5, the larger the pulse width of pulse-width modulated signal PB1.

Usually, in D-class amplification operation, the control of the pulse width is released by pulse-width control circuit 4-1 and pulse-width control circuit 4-2. In conventional D-class amplification operation, for example, the circuit block for control of pulse width shown in FIG. 2 is bypassed with a signal bypass circuit not shown in the figure. As a result, pulse-width modulated signals PA1, PA2 may be output as pulse-width modulated signals PB1, PB2 as is.

The above is an explanation of pulse-width control circuit 4-1 (pulse-width control circuit 4-2) shown in FIG. 2. Now, return to FIG. 1. When a D-class amplification operation is started/stopped, pulse-width control signal generating circuit 5 generates control signal S5 for controlling the pulse widths of pulse-width modulated signals PB1, PB2.

When a D-class amplification operation is started, pulse-width control signal generating circuit 5 generates control signal S5 (third state) such that the capacitance of capacitor circuit 43 is set at a predetermined minimum value (that is, the pulse widths of pulse-width modulated signals PB1, PB2 become the minimum). Due to variation in signal S2 of signal generator 2, the pulse interval between the pulse-width modulated signals PB1, PB2 becomes the maximum (the second state), and pulse-width control signal generating circuit 5 generates control signal S5 such that the capacitance of capacitor circuit 43 is gradually increased from a predetermined minimum value to a predetermined maximum value (that is, the pulse widths of pulse-width modulated signals PB1, PB2 are gradually decreased from the minimum values to the maximum values (with a duty ratio of 50%)). When the capacitance of capacitor circuit 43 reaches the predetermined maximum value, the pulse widths of pulse-width modulated signals PB1, PB2 become nearly equal, and each has a duty ratio of about 50%.

On the other hand, when a D-class amplification operation is stopped, pulse-width control signal generating circuit 5 generates control signal S5 such that after pulse-width modulated signals PA1, PA2 reach a state (second state) in which they are in phases opposite each other with a duty ratio of 50% due to the operation of mute circuit 1, the capacitance of capacitor circuit 43 gradually decreases from a predetermined maximum value to a predetermined minimum value (that is, the pulse widths of pulse-width modulated signals PB1, PB2 gradually decrease from the maximum value (with a duty ratio of 50%) to the minimum value). As a result, the pulse widths of the pulse width modulated signals PB1, PB2 become their predetermined minimum values, respectively (the third state).

Output stop circuits 6-1, 6-2 are circuits for stopping switching of output signals Pout1, Pout2 when a D-class amplification operation is stopped. For example, as shown in FIG. 1, output stop circuit 6-1 has switching circuits SW2, SW3. The switching circuit SW2 is inserted in the signal path between the output of pulse-width control circuit 4-1 and the input of output circuit 7-1. Switching circuit SW3 is connected between the input terminal of output circuit 7-1 and reference potential GND.

When a D-class amplification operation is performed, switching circuit SW2 is turned ON, and switching circuit SW3 is turned OFF, so the output of pulse-width control circuit 4-1 and the input of output circuit 7-1 are connected to each other. On the other hand, when a D-class amplification operation is stopped, switching circuit SW2 is turned OFF, while switching circuit SW3 is turned ON, so the output of pulse-width control circuit 4-1 and the input of output circuit 7-1 are cut off from each other, and, because the input of output circuit 7-1 is fixed at reference potential GND, the switching operation of output circuit 7-1 is stopped. For example, as shown in FIG. 1, the output stop circuit 6-2 also has the same arrangement as that of the output stop circuit 6-1, and it performs the same operation as above. The output circuits 7-1, 7-2 generate output signals Pout1, Pout2 in pulse form corresponding to the pulse-width modulated signals PB1, PB2, so that a load not shown in the figure is driven.

Figure 4:
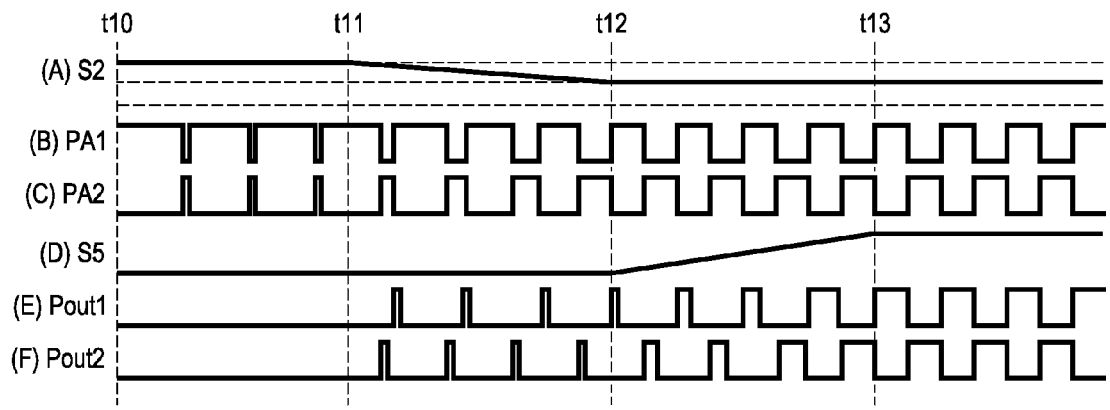
FIG. 4 is a waveform diagram illustrating an example of operation when a D-class amplification operation is started in the D-class amplifier shown in FIG. 1.

FIG. 4 is a waveform diagram illustrating an example of the operation of a D-class amplifier when a D-class amplification operation is started. First of all, during time t10-t11, switching circuit SW1 selects signal generator 2, and signal S2 of signal generator 2 is input to pulse-width modulating circuit 3. In this case, signal generator 2 sets the level of signal S2 such that the (positive) pulse width of pulse-width modulated signal PA1 is at a maximum, and the (positive) pulse width of pulse-width modulated signal PA2 is at a minimum. Also, the pulse-width control signal generating circuit 5 generates control signal S5 such that the pulse widths of both pulse-width modulated signals PB1, PB2 are at a minimum. In time t10-t11, output stopping circuits 6-1, 6-2 stops switching of output circuits 7-1, 7-2, and output signals Pout1, Pout2 are fixed at reference potential GND.

At time t11, when output stopping circuits 6-1, 6-2 release the stop state of output, the output signals Pout1, Pout2 become a pulse-like waveform corresponding to pulse-width modulated signals PB1, PB2 (FIG. 4(E), (F)). The pulse of the output signal Pout1 is generated at the rise edge of pulse-width modulated signal PA1, and the pulse of output signal Pout2 is generated at the rise edge of pulse-width modulated signal PA2. Near time t11, the pulse width of pulse-width modulated signal PA1 is at a maximum, and the pulse width of pulse-width modulated signal PA2 is at a minimum, so the pulse interval between output signals Pout1, Pout2 is at a minimum.

When the pulse interval of output signals Pout1, Pout2 is minimum, the driving signal fed to the load as the differential signal of output signals Pout1, Pout2 contains most of the relatively high frequency component. Consequently, for example, when an audio signal is amplified, most of the noise component is excluded from the audible frequency range. When the high frequency component is removed by a low-pass filter, the level of the noise component that passes through the low-pass filter is reduced. In this case, the pulse widths of output signals Pout1, Pout2 set at the minimum value are nearly equal, so the average value of the differential signal of output signals Pout1, Pout2 is about zero.

In time t11-t12, signal generator 2 gradually lowers the level of signal 2 from the maximum value to the reference value (FIG. 4(A)). As a result, pulse-width modulated signals PA1, PA2 are gradually changed from a state (first state) in which their pulse widths are maximum and minimum, respectively, to a state (second state) in which they are nearly equal (duty ratio of 50%) (FIG. 4(B), (C)). Due to this change, the pulse interval between output signals Pout1, Pout2 as time t11 is approached gradually increases, and, at time t12, the pulse interval is at a maximum. When the pulse interval is at a maximum, the phase difference between output signals Pout1, Pout2 is about 180°.

Then, in time t12-t13, pulse-width control signal generating circuit 5 gradually increases the setting value of control signal S5 from the minimum value to the maximum value (FIG. 4(D)). As a result, the pulse widths of output signals Pout1, Pout2 gradually decrease from the minimum value, and, at time t13, the two signals become signals in phases opposite each other and with a duty ratio of 50%. That is, the phase difference between output signals Pout1, Pout2 is about 180°, and each has a duty ratio of about 50%, and the waveforms of output signals Pout1, Pout2 (pulse-width modulated signals PB1, PB2) and the waveforms of pulse-width modulated signals PA1, PA2 become nearly equal.

At time t13, the average value of the differential signal of output signals Pout1, Pout2 is nearly held at zero. At time t13, when the waveforms of pulse-width modulated signals PB1, PB2 become nearly equal to those of pulse-width modulated signals PA1, PA2, control of the pulse width of pulse-width control circuit 4-1 and pulse-width control circuit 4-2 is released. For example, by means of a bypass operation of a signal bypass circuit not shown in the figure, pulse-width modulated signals PA1, PA2 are output as pulse-width modulated signals PB1, PB2. Also, switching circuit SW1 selects input signal Sin, and input signal Sin is input to pulse-width modulating circuit 3. Subsequently, output signals Pout1, Pout2 become pulse-width modulated signals corresponding to input signal Sin, with one of them rising while the other falls.

In the following, an explanation will be given regarding the operation when a D-class amplification operation is stopped.

Figure 5:
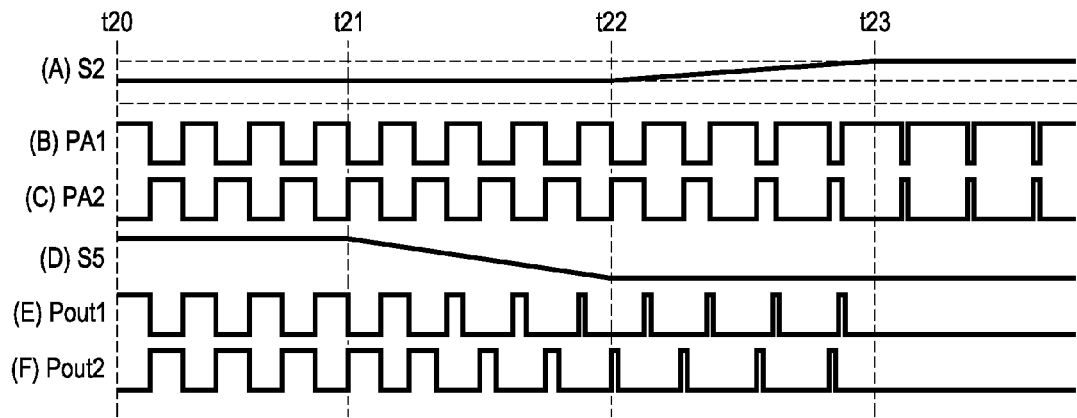
FIG. 5 is a waveform diagram illustrating an example of operation when a D-class amplification operation is stopped in the D-class amplifier shown in FIG. 1.
Figure 6:
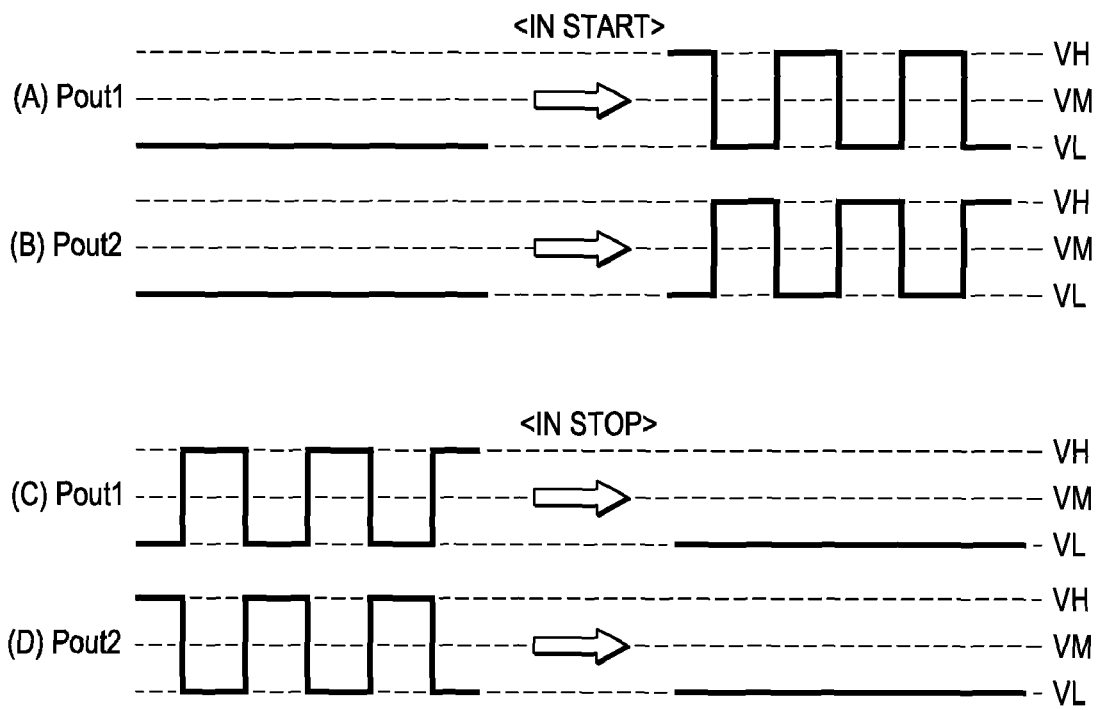
FIG. 6 is a waveform diagram illustrating variation in the output signal in start/stop of a D-class amplifier.

FIG. 5 is a waveform diagram illustrating an example of the operation of the D-class amplifier when a D-class amplification operation is stopped. First of all, in time t20-t21, mute circuit 1 controls such that input signal Sin is attenuated to the reference value, and pulse-width modulated signals PA1, PA2 become signals in phases opposite each other and with a duty ratio of 50%. As a result, pulse-width modulated signals PA1, PA2 gradually become equal (the second state). In this case, the phase difference of output signals Pout1, Pout2 becomes about 180°, and each signal has a duty ratio of about 50% (FIG. 5(E), (F)). The average value of the differential signal of output signals Pout1, Pout2 is nearly zero.

Then, at time t21, pulse-width control circuit 4-1 and pulse-width control circuit 4-2 start an operation for controlling the pulse width. The pulse-width control signal generating circuit 5 generates control signal S5 such that the setting value of control signal S5 is gradually decreased from the maximum value to the minimum value (FIG. 5(D)). As a result, the pulse widths of output signals Pout1, Pout2 (with a duty ratio of about 50%) gradually decrease, and, at time t22, the pulse widths of the two signals become the minimum (the third state). In this case, pulse-width control circuit 1 and pulse-width control circuit 4-2 reduce the pulse widths of output signals Pout1, Pout2 when their fall edges approach the rise edges, so that also at time t22, the phase difference between output signals Pout1, Pout2 is kept at about 180°, and the pulse interval between the two signals reaches a maximum.

In time t21-t22, while the state with equal pulse width for output signals Pout1, Pout2 is kept as is, the pulse widths of the two signals decrease, and, during this period, the average value of the differential signal between output signals Pout1, Pout2 is kept close to zero.

On the other hand, in period of time t21-t22, switching circuit SW1 selects signal generator (2). Signal S2 of signal generator (2) is input to pulse-width modulating circuit (3). In this case, signal generator (2) has the level of signal S2 set at the reference value such that the pulse widths of pulse width modulated signals PA1, PA2 are equal to each other just as in the period of time t20-t21.

During the period of time t22-t23, signal generator 2 gradually changes the level of signal S2 from the reference value to the maximum value (FIG. 5(A)). As a result, while the pulse width of pulse-width modulated signal PA1 is gradually increased, the pulse width of pulse-width modulated signal PA2 is gradually decreased. At time t23, the pulse width of pulse-width modulated signal PA1 reaches the maximum value, while the pulse width of pulse-width modulated signal PA2 reaches the minimum value (the first state).

Near time t22, the pulse interval between output signals Pout1, Pout2 reaches a maximum, yet the pulse widths of pulse-width modulated signals PA1, PA2 vary as mentioned above. As a result, while the pulses of output signals Pout1, Pout2 generated at the rise edge gradually approach each other, the pulse interval between the two signals at time t23 reaches a minimum. As the pulse interval decreases, the driving signal fed to the load as the differential signal of output signals Pout1, Pout2 contains more of a high frequency component. With the pulse widths of the output signals Pout1, Pout2 and the pulse interval between the two signals reach a minimum, at time t23, output stopping circuits 6-1, 6-2 stop switching of output circuits 7-1, 7-2, and output signals Pout1, Pout2 are fixed at reference potential GND (FIG. 5(E), (F)).

As explained above, for the D-class amplifier in this embodiment, when the D-class amplification operation is started/stopped, the pulse widths of output signals Pout1, Pout2 and the pulse interval are gradually changed, so it is possible to prevent a large variation in the signal fed to the load as the differential signal of output signals Pout1, Pout2, so it is possible to reduce noise. Also, by gradually reducing the pulse interval of the differential output, the noise component is removed from the audible band on the high frequency side, so it is possible to reduce the noise caused by discontinuity of the output at the start of switching, which has previously been hard to avoid for a D-class amplifier.

That is, by keeping constant pulse widths of output signals Pout1, Pout2 while gradually changing the pulse interval, it is possible to suppress variation in the relatively high frequency component corresponding to the component of the pulse signal, so it is possible to suppress variation in the relatively low frequency component corresponding to the average value of the pulse signal.

Additionally, various modifications can be made. For example, in the circuit shown in FIG. 2, the discharge time of the capacitor is used to control the pulse width. However, the present invention is not limited to this scheme. For example, one may also adopt a digital circuit in which the count value of a clock is used to generate a signal with a desired pulse width or various other circuit arrangements to control the pulse width. The D-class amplifier of the present invention is not limited to the amplifier of an audio signal. It may also be used widely in amplifiers in various applications.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. A D-class amplifier comprising:
    a pulse-width modulation generating first signal and a second output signals being pulse-width modulated corresponding to an input signal and with one rising while the other falls; and
    signal processing circuit that when the D-class amplification operation starts, while the pulse widths of the first signal and the second output signals are set at a predetermined minimum value, an pulse interval between the pulses of both signals is set at a predetermined minimum value, the pulse interval is then slowly increased from a minimum value, and when the pulse interval reaches a maximum value, the pulse width is gradually increased until the first signal and the second signal become signals with a duty ratio of 50% and in phases opposite each other, and wherein the signal processing circuit gradually reduces the pulse widths of the first signal and the second signal when the D-class amplification operation is stopped, and it sets each of the pulse widths at the minimum values, respectively, and, at the same time, sets the pulse interval between the first signal and the second signal at the maximum, and it then gradually reduces the pulse interval to the predetermined minimum value.

2. The D-class amplifier described in claim 1 wherein the signal processing circuit further comprises:
    an input signal control circuit that controls the input signal such that when the D-class amplification operation starts, the pulse width is changed slowly from a first state, in which one of the first modulated signal and the second modulated signal has a minimum pulse width while the other has a maximum pulse width, to a second state, in which the first modulated signal and the second modulated signal have the same pulse width; and
    a pulse-width control circuit, which is a pulse-width control circuit that outputs pulse-width controlled signals as the first signal and the second signal as the fall times of the first modulated signal and the second modulated signal approach the rise times, or the rise times approach the fall times, and which controls the pulse width when the D-class amplification operation is started so that a third state results in which the pulse widths of the first signal and second signal become minimum values, respectively, and the pulse-width control is gradually decreased and released when the second state is reached.

3. The D-class amplifier described in claim 2 wherein:
    the pulse-width control circuit has:
        a first pulse-width control circuit that controls the pulse width of the first signal;
        a second pulse-width control circuit that controls the pulse width of the second signal; and
        a control circuit;
    the first pulse-width control circuit and the second pulse-width control circuit each include:
        a signal output circuit, which outputs the first signal having a first level when the voltage of the input terminal is higher than the threshold or the second signal having a second level when the voltage is lower than the threshold;
        a capacitor circuit, which is connected to the input terminal and for which the capacitance varies corresponding to the control signal of the control circuit;
        a detecting circuit, which detects the rise time or fall time of the first modulated signal or the second modulated signal; and
        a charge/discharge circuit, which charges the capacitor circuit such that the voltage of the input terminal exceeds the threshold when the detecting circuit detects the rise time or the fall time, and which discharges the capacitor circuit at a constant current such that the voltage of the input terminal falls below the threshold after the charging;
    the control circuit sets the capacitance of the capacitor circuit at a first value when a D-class amplification operation is started, and it gradually changes the capacitance of the capacitor circuit to a second value larger than the first value when the second state is reached.

4. A D-class amplifier comprising:
    the D-class amplifier has
    a pulse-width modulated signal generating circuit that responds to an input signal to generate a first pulse-width modulated signal and a second pulse-width modulated signal, which have their rise edge and fall edge synchronized with the fall edge and rise edge;
    a pulse-width control circuit that generates third and fourth pulse-width modulated signals having predetermined pulse widths and synchronized with the rise edge or fall edge of the first and second pulse-width modulated signals, respectively;
    and an output circuit that outputs the third and fourth pulse-width modulated signals as the first and second output signals;
    the pulse-width modulated signal generating circuit contains a circuit that gradually changes the pulse widths of the first and second pulse-width modulated signals such that the state changes from a first state in which the pulse width of the first pulse-width modulated signal is large, while the pulse width of the second pulse-width modulated signal is small, to a second state in which the duty ratios of each of the first and second pulse-width modulated signals are 50%;
    the pulse-width control circuit contains a circuit that gradually controls the pulse widths of the third and fourth pulse-width modulated signals such that the state changes from a third state in which the pulse widths of the third and fourth pulse widths are small to a fourth state in which the duty ratios of the third and fourth pulse-width modulated signals are 50%;

by changing the pulse widths of the first and second pulse-width modulated signals from the first state to the second state, the state is changed from a state in which the phase difference of the third and fourth pulse-width modulated signals is small to a state in which the phase difference is 180°;

and, by changing the first and second pulse-width modulated signals from the first state to the second state, and changing the third and fourth pulse-width modulated signals from the third state to the fourth state, the pulse waveforms of the third and fourth pulse-width modulated signals are controlled to become identical to the pulse waveforms of the first and second pulse-width modulated signals.

5. An apparatus comprising:
a pulse-width modulator;
a first pulse-width modulator controller that is coupled to the pulse width modulator and that generates a first signal;
a second pulse-width modulator controller that is coupled to the pulse width modulator and that generates a second signal;
a pulse-width control signal generator that is coupled to provide a control signal to each of the first and second pulse-width modulator controllers, wherein, in a start mode, the control signal increases the pulse widths of the first and second signals from a predetermined minimum until the first and second output signals have a 50% duty cycle in phases opposite each other, and wherein, in a stop mode, the control signal decreases the pulse widths of the first and second output signals, which have a 50% duty cycle that in phases opposite each other, until the pulse widths of the first and second signals reach the predetermined minimum;
a signal generator that generates an input signal for the pulse-width modulator in the start mode and the stop mode, wherein the signal generator changes from a first state to a second state in the start mode and changes from the second state to the first state in the stop mode, and wherein the pulse widths of the first and second signals are at the predetermined minimum when the second state of the input signal is provided to the pulse-width modulator; and
a switch that is coupled between the signal generator and the pulse-width modulator, wherein the switch couples the signal generator to the pulse-width modulator in the start and stop modes.

6. The apparatus of claim 5, wherein each of the first and second pulse-width modulator controllers further comprises:
an edge detector that is coupled to the pulse-width modulator;
a charge/discharge circuit that is coupled to the edge detector;
a capacitor circuit that is coupled to the charge/discharge circuit and the pulse-width control signal generator, wherein the capacitor circuit receives the control signal;
an output circuit that is coupled to the capacitor circuit; and
a pulse-width limiter that is coupled to the output circuit.

7. The apparatus of claim 6, wherein the edge detector further comprises:
an AND gate that is coupled to the pulse-width modulator;
a delay circuit that is coupled to the pulse-width modulator; and
an inverter that is coupled to the delay circuit and the AND gate.

8. The apparatus of claim 6, wherein the charge/discharge circuit further comprises:
a current source;
a current mirror that is coupled to the current source;
a first inverter that is coupled to the edge detector;
a second inverter that is coupled between the first inverter and the capacitor circuit and that is coupled to the current mirror.

9. The apparatus of claim 6, wherein the switch further comprises a first switch, and wherein the capacitor circuit further comprises a plurality of branches coupled in parallel with one another, wherein each branch includes:
a second switch that is coupled to the charge/discharge circuit and the output circuit, wherein the switch is controlled by the control signal; and
a capacitor that is coupled between the second switch and ground.

10. The apparatus of claim 6, wherein output circuit further comprises a plurality of inverters coupled in series with one another.

11. The apparatus of claim 6, wherein the pulse-width limiter further comprises an AND gate.

12. The apparatus of claim 5, wherein the apparatus further comprises:
a first stop circuit that is coupled to the first pulse-width modulator controller;
a second stop circuit that is coupled to the second pulse-width modulator controller;
a first output circuit that is coupled to the first stop circuit; and
a second output circuit that is coupled to the second stop circuit.

* * * * *